(12) United States Patent
Yoon et al.

(10) Patent No.: US 9,261,555 B2
(45) Date of Patent: Feb. 16, 2016

(54) METHODS OF MEASURING AND CONTROLLING INNER TEMPERATURE OF A CHAMBER INCLUDED IN A TEST HANDLER

(71) Applicant: Samsung Electronics Co., Ltd., Suwon-Si, Gyeonggi-Do (KR)

(72) Inventors: Sang-Kyu Yoon, Asan-si (KR); Sang-Joon Ryu, Asan-si (KR); Hwa-Cheol Lee, Cheonan-si (KR); Yong-Hwan Cho, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 451 days.

(21) Appl. No.: 13/771,359

(22) Filed: Feb. 20, 2013

(65) Prior Publication Data

US 2013/0223475 A1    Aug. 29, 2013

(30) Foreign Application Priority Data

Feb. 28, 2012  (KR) .................. 10-2012-0020022

(51) Int. Cl.

| | | |
|---|---|---|
| *G01K 7/00* | (2006.01) | |
| *G01K 13/00* | (2006.01) | |
| *G01K 3/00* | (2006.01) | |
| *G01K 1/00* | (2006.01) | |
| *G01R 31/26* | (2014.01) | |
| *G01R 31/28* | (2006.01) | |
| *G11C 29/06* | (2006.01) | |
| *G11C 29/56* | (2006.01) | |
| *G11C 11/40* | (2006.01) | |

(52) U.S. Cl.
CPC ........ *G01R 31/2642* (2013.01); *G01R 31/2856* (2013.01); *G11C 29/06* (2013.01); *G11C 29/56* (2013.01); *G11C 29/56016* (2013.01); *G01R 31/2874* (2013.01); *G11C 11/40* (2013.01)

(58) Field of Classification Search
USPC .......................... 374/178, 141, 110, 208, 166
See application file for complete search history.

(56) References Cited

U.S. PATENT DOCUMENTS

| | | | | |
|---|---|---|---|---|
| 5,652,729 | A * | 7/1997 | Iwata et al. ................. | 365/222 |
| 6,075,739 | A * | 6/2000 | Ihara .......................... | 365/222 |
| 6,970,393 | B1 * | 11/2005 | Cho et al. .................... | 365/222 |
| 2004/0004867 | A1 * | 1/2004 | Schnabel et al. ............ | 365/200 |
| 2005/0007864 | A1 * | 1/2005 | Chung et al. ................ | 365/232 |
| 2006/0066386 | A1 * | 3/2006 | Hong .......................... | 327/513 |
| 2006/0077742 | A1 * | 4/2006 | Shim et al. .................. | 365/222 |
| 2006/0104140 | A1 * | 5/2006 | Tahara ........................ | 365/222 |
| 2007/0036015 | A1 | 2/2007 | Sako | |

(Continued)

FOREIGN PATENT DOCUMENTS

| | | |
|---|---|---|
| KR | 10-0641913 B1 | 11/2006 |
| KR | 10-0711265 B1 | 4/2007 |
| KR | 10-0713945 B1 | 5/2007 |

*Primary Examiner* — Mirellys Jagan
(74) *Attorney, Agent, or Firm* — Harness, Dickey & Pierce, P.L.C.

(57) ABSTRACT

To measure an inner temperature of a chamber included in a test handler, self-refresh currents of semiconductor memory devices under test are measured. The semiconductor memory devices are disposed in the chamber and have a function of linear temperature compensated self-refresh (Li-TCSR). Local temperature values are generated based on the self-refresh currents, where each local temperature value indicates a temperature near the corresponding semiconductor memory device of the semiconductor memory devices under test.

19 Claims, 8 Drawing Sheets

(56) References Cited

U.S. PATENT DOCUMENTS

2007/0133653 A1* 6/2007 Lee et al. .................. 374/112
2007/0171956 A1* 7/2007 Noguchi .................... 374/100
2007/0242536 A1* 10/2007 Matsubara ............... 365/189.09
2007/0268766 A1* 11/2007 Mori ......................... 365/212
2011/0055671 A1* 3/2011 Kim et al. .................. 714/800

* cited by examiner

METHODS OF MEASURING AND CONTROLLING INNER TEMPERATURE OF A CHAMBER INCLUDED IN A TEST HANDLER

CROSS-REFERENCE TO RELATED APPLICATION

This application claims priority under 35 USC §119 to Korean Patent Application No. 10-2012-0020022, filed on Feb. 28, 2012, in the Korean Intellectual Property Office (KIPO), the contents of which are herein incorporated by reference in their entirety.

BACKGROUND

1. Technical Field

Some example embodiments relate generally to semiconductor devices, and more particularly, to methods of measuring and controlling an inner temperature of a chamber included in a test handler in real-time.

2. Description of the Related Art

In general, semiconductor devices require a test process and a test handler is used to simultaneously test a plurality of semiconductor devices under severe conditions such as higher temperatures beyond room temperature. For example, 256 or 512 semiconductor memory devices may be mounted and disposed in a chamber of the test handler and the inner space of the chamber may be filled with nitrogen gas. Using a heater and a fan included in the chamber, the inner air of the chamber may be set to a given (or, alternatively predetermined) test temperature. The inner temperature of the chamber may be monitored using temperature sensors to control the heater and the fan so that the inner temperature may be maintained at the set temperature.

Even though the performance of the heater directly affects the temperature distribution in the chamber, it is difficult to control the temperature distribution exactly because of the heat caused by the respective semiconductor memory devices under test. To enhance yield and reliability of products through the test, the operational temperature of the respective semiconductor memory device under test needs to be maintained near the given (or, alternatively predetermined) target temperature. It is most desirable to provide a temperature control system capable of independently controlling the operational temperature of each device under test but such temperature control system increases testing costs as the number of the devices tested simultaneously increases.

SUMMARY

Some example embodiments provide a method of measuring an inner temperature of a chamber included in a test handler in real-time by measuring self-refresh currents of devices under test where the devices have function of linear temperature compensated self-refresh (Li-TCSR).

Other example embodiments provide a method of measuring an inner temperature of a chamber included in a test handler in real-time capable of conveniently monitoring temperature distribution in the chamber by displaying local temperatures corresponding to devices under test in a two-dimensional map on a monitor screen.

Other example embodiments provide a method of controlling an inner temperature of a chamber included in a test handler in real-time capable of conveniently adjusting offset values for controlling the inner temperature of the chamber.

Some example embodiments provide a method of controlling an inner temperature of a chamber included in a test handler in real-time capable of exactly testing semiconductor devices that don't have the function of Li-TCSF.

According to an example embodiment, a method of measuring an inner temperature of a chamber included in a test handler includes measuring self-refresh currents of semiconductor memory devices under test, and generating local temperature values based on the self-refresh currents. The semiconductor memory devices under test are disposed in the chamber and have a function of linear temperature compensated self-refresh (Li-TCSR). Each local temperature value indicates a temperature near a corresponding semiconductor memory device of the semiconductor memory devices under test.

In an example embodiment, the local temperature values may be displayed in a two-dimensional map on a monitor screen such that a disposition of the local temperature values in the two-dimensional map corresponds to a disposition of the semiconductor memory devices under test in the chamber.

In an example embodiment, the local temperature values may be represented by one of a numerical display, a color display and a combination of the numerical display and the color display.

In an example embodiment, a temperature variation curve may be displayed on the monitor screen, the temperature variation curve corresponding to a selected device among the semiconductor memory devices under test.

In an example embodiment, temperature variation curves may be displayed on the monitor screen such that the temperature variation curves are overlapped, each temperature variation curve of the temperature variation curves corresponding to each semiconductor device of the semiconductor memory devices under test.

In an example embodiment, sensor temperature values may be received from temperature sensors in the chamber, and the sensor temperature values may be displayed in a two-dimensional map on a monitor screen such that a disposition of the sensor temperature values in the two-dimensional map corresponds to a disposition of the temperature sensors in the chamber.

In an example embodiment, the semiconductor memory devices under test may be mobile dynamic random access memory (DRAM) devices.

According to another example embodiment, a method of controlling an inner temperature of a chamber included in a test handler in real-time includes measuring self-refresh currents of semiconductor memory devices, generating local temperature values based on the self-refresh currents, and receiving sensor temperature values from temperature sensors in the chamber. The semiconductor memory devices are disposed in the chamber and have a function of linear temperature compensated self-refresh (Li-TCSR). Each local temperature value indicates a temperature near a corresponding semiconductor memory device of the semiconductor memory devices. Each sensor temperature indicating a temperature near a corresponding temperature sensor of the temperature sensors. The local temperature values are compared with the sensor temperature values. Offset values are adjusted for controlling the inner temperature of the chamber based on the comparison results.

In an example embodiment, the local temperatures may be displayed in a two-dimensional map on a monitor screen such that a disposition of the local temperature values in the two-dimensional map corresponds to a disposition of the semiconductor memory devices under test in the chamber, and the sensor temperature values may be displayed in the two-dimensional map on the monitor screen such that a disposition of the sensor temperature values in the two-dimensional map corresponds to a disposition of the temperature sensors in the chamber.

In an example embodiment, the local temperature values may be represented by one of a numerical display, a color display and a combination of the numerical display and the color display.

In an example embodiment, a temperature variation curve may be displayed on the monitor screen, the temperature variation curve corresponding to a selected device among the semiconductor memory devices.

In an example embodiment, temperature variation curves may be displayed on the monitor screen such that the temperature variation curves are overlapped, each temperature variation curve of the temperature variation curves corresponding to each semiconductor device of the semiconductor memory devices.

In an example embodiment, the semiconductor memory devices are mobile dynamic random access memory (DRAM) devices and the chamber may be configured to test semiconductor devices different from the mobile DRAM devices.

In an example embodiment, the mobile DRAM devices may be packaged on a test substrate, the mobile DRAM devices having same input-output connections as the semiconductor devices.

According to another example embodiment, a method of controlling an inner temperature of a chamber included in a test handler in real-time, the chamber configured to test first semiconductor devices, includes measuring self-refresh currents of second semiconductor memory devices, generating local temperature values based on the self-refresh currents, and adjusting offset values for controlling the inner temperature of the chamber based on the local temperature values. The second semiconductor memory devices are disposed in the chamber and have a function of linear temperature compensated self-refresh (Li-TCSR). Each local temperature value corresponds to a temperature near the corresponding second semiconductor memory device of the second semiconductor memory devices.

According to another example embodiment, a method of controlling an inner temperature of a chamber included in a test handler includes measuring self-refresh currents of semiconductor memory devices in the chamber, generating local temperature values based on the self-refresh currents, each local temperature value indicating a temperature near a corresponding semiconductor memory device of the semiconductor memory devices, and adjusting offset values based on the local temperature values.

In an example embodiment, the local temperature values may be displayed in a two-dimensional map on a monitor screen such that a disposition of the local temperature values in the two-dimensional map corresponds to a disposition of the semiconductor memory devices in the chamber.

In an example embodiment, the local temperature values may be represented by one of a numerical display, a color display and a combination of the numerical display and the color display.

In an example embodiment, a temperature variation curve may be displayed on the monitor screen, the temperature variation curve corresponding to a selected device among the semiconductor memory devices.

In an example embodiment, sensor temperature values may be received from temperature sensors in the chamber, and the sensor temperature values may be displayed in a two-dimensional map on a monitor screen such that a disposition of the sensor temperature values in the two-dimensional map corresponds to a disposition of the temperature sensors in the chamber.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
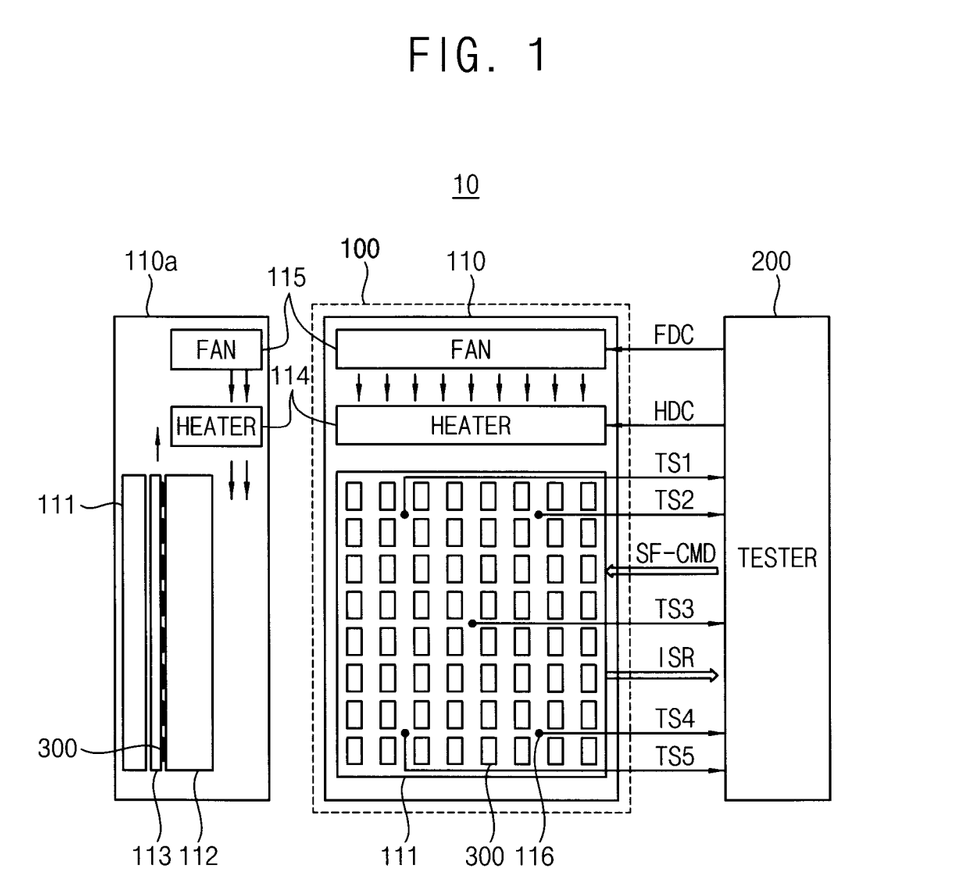
FIG. 1 is a diagram illustrating a test system according to an example embodiment.
Figure 2:
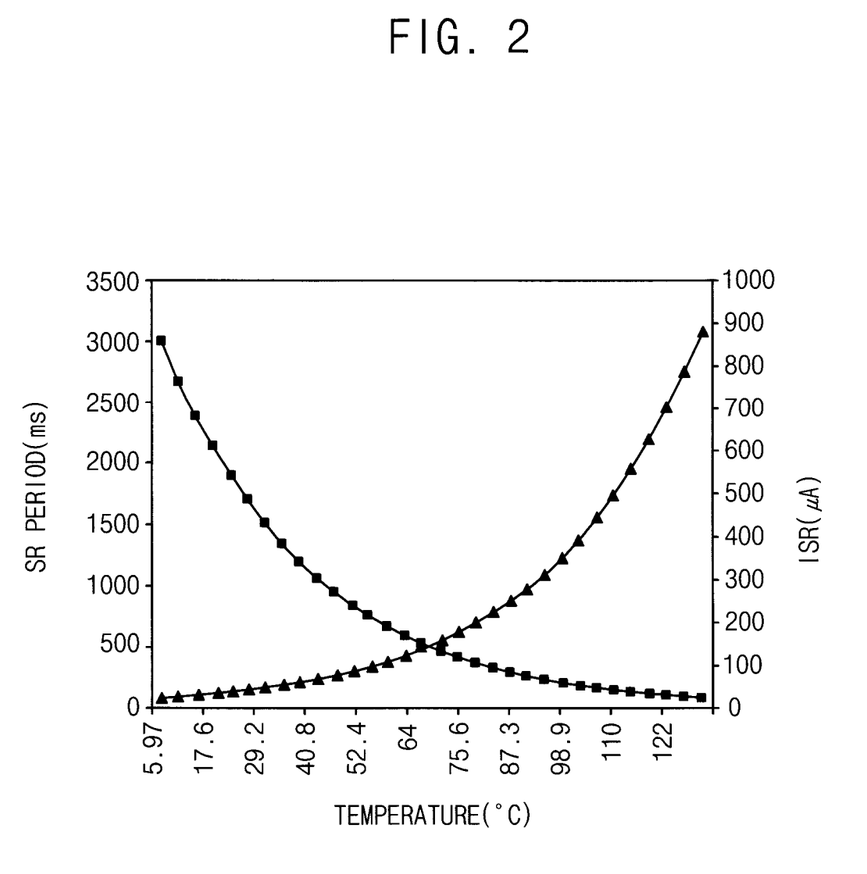
FIG. 2 is a diagram illustrating operational characteristic of a mobile dynamic random access memory (DRAM) device having function of linear temperature compensated self-refresh (Li-TCSR).
Figure 3:
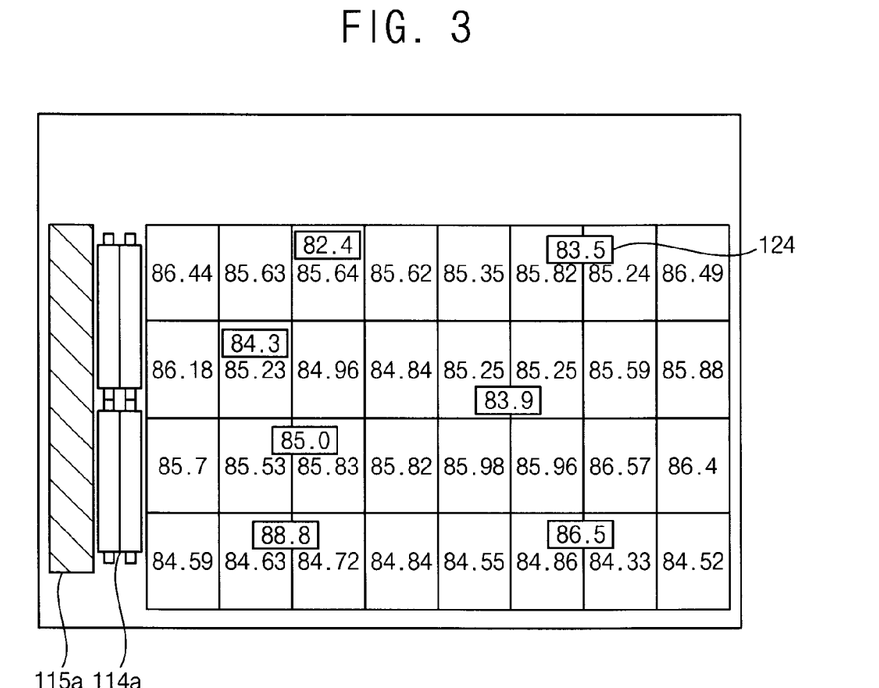
FIG. 3 is a diagram illustrating an example of a two-dimensional map displayed on a monitor screen according to an example embodiment.

FIG. 1 is a diagram illustrating a test system according to example embodiments, FIG. 2 is a diagram illustrating operational characteristic of a mobile dynamic random access memory (DRAM) device having function of linear temperature compensated self-refresh (Li-TCSR) and FIG. 3 is a diagram illustrating an example of a two-dimensional map displayed on a monitor screen according to example embodiments.

Referring to FIG. 1, a test system 10 may include a test handler 100 and a tester 200. The test handler 100 may include a test chamber 110, a loading chamber (not shown) and an unloading chamber (not shown). A plurality of semiconductor devices 300 to be tested are loaded in the loading chamber and then transferred to the test chamber 110. The semiconductor memory devices 300 are tested in the test chamber 110 and unloaded to the unloading chamber after the test is completed.

FIG. 1 also illustrates a side view 110a of the test chamber 110. A test board 111 is mounted in the test chamber 110 and a match plate 112 is disposed on the test board 111. A tray 113 for providing the semiconductor devices 300 to be tested is inserted between the test board 111 and the match plate 112. The semiconductor devices 300 on the tray 113 are moved to the match plate 112 by vacuum absorption and then combined to sockets on the test board 111. The test board 111 may include a high-fix board and sockets disposed on the high-fix board and the semiconductor devices 300 may be electrically connected to the tester 200 through the high-fix board and the sockets. The test chamber 110 includes a heater 114 and a fan 115 for controlling inner temperature of the test chamber 110. Temperature sensors 116 may be disposed on the match plate 112 to measure a temperature of several portions in the test chamber 110.

The inner space of the test chamber 110 is filled with nitrogen gas that may be heated and circulated by the heater 114 and the fan 115 to heat the semiconductor devices 300 to be tested to a given (or, alternatively predetermined) test temperature.

In such temperature control system, it is difficult to monitor exact temperature distribution among the relatively large number of the semiconductor devices 300 because the number of the temperature sensors 116 is limited. In addition, the conventional test handler performs calibration of temperature offset occasionally, for example, once per year, and thus problems of relatively low yield and reliability of the tested products may occur.

In the method of measuring inner temperature of a chamber included in a test handler according to some example embodiments, local temperature values may be obtained using linear temperature compensated self-refresh (Li-TCSR) circuits included in the devices under test (DUTs), where each local temperature value indicates a temperature near the corresponding semiconductor memory device.

The Li-TCSR circuit is generally configured to automatically adjust its self-refresh period depending on the operational temperature. The self-refresh current ISR is changed depending on the change of the self-refresh period. Thus, the local temperature values may be obtained by measuring the self-refresh currents and converting the current values to the temperature values by the tester 200.

The tester 200 may output a self-refresh command SF-CMD to operate the DUTs 300 in a self-refresh mode and then measure the self-refresh currents ISR of the DUTs 300, respectively. The tester 200 may convert the measured current values to the local temperature values based on the relation between the self-refresh current and the temperature as illustrated in FIG. 2. The current-to-temperature conversion may be performed by the tester 200 using a look-up table or a conversion function. The tester 200 may receive the sensor temperature values TS1 through TS5 from the temperature sensors 116 and provide a heater driving signal HDC and a fan driving signal FDC based on the sensor temperatures.

The tester 200 may transfer the temperature data to a computing system such as a personal computer and a central control computer through a serial communication channel. The transferred temperature data may be displayed in a two-dimensional map on a monitor screen as illustrated in FIG. 3 for providing a graphic user interface. In FIG. 3, the numerals in the boxes arranged in a matrix form represent the local temperature values and the numerals in the six small boxes 124 represent the sensor temperature values.

A disposition of the local temperature values in the two-dimensional map corresponds to a disposition of the semiconductor memory devices 300, that is, the DUTs in the chamber 110. The local temperature values in the two dimensional map may be represented by a numerical display as illustrated in FIG. 3, a color display or a combination of the numerical display and the color display. The heater image 114a and the fan image 115a may be further displayed to indicate the location of the heater and the fan.

Through such display of the temperature data, the temperature distribution in the chamber 110 may be monitored conveniently. As illustrated in FIG. 3, the local temperature values and the sensor temperature values may be displayed together in the two-dimensional map so that the local temperature values corresponding to the DUTs 300 may be more easily compared with the sensor temperature values provided by the temperature sensors 116.

Figure 4:
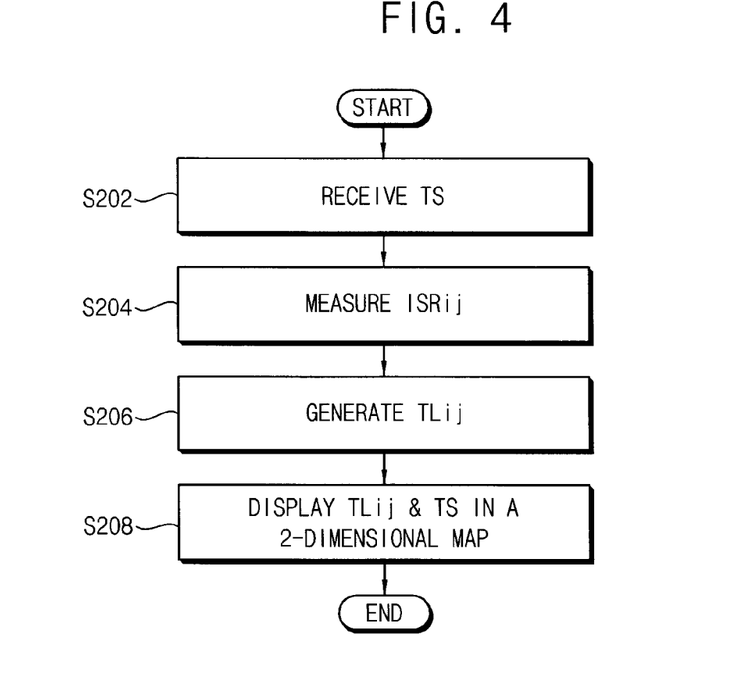
FIG. 4 is a flowchart illustrating a method of measuring inner temperature of a chamber included in a test handler according to another example embodiment.

FIG. 4 is a flowchart illustrating a method of measuring inner temperature of a chamber included in a test handler according to another example embodiment.

Referring to FIGS. 1 through 4, the tester 200 executes a temperature control program and output the heater driving signal HDS and the fan driving signal FDS to heat and circulate the inner air of the chamber 110. The tester 200 receives the sensor temperature values TS from the temperature sensors 116 (operation S202). The tester 200 outputs the self-refresh command SF-CMD to operate the DUTs 300 in the self-refresh mode. The Li-TCSF circuit in the DUT 300 senses the respective operational temperature and adjusts the self-refresh period. The tester 200 measures the self-refresh currents ISRij of the respective DUTs 300 (operation S204). The DUTs 300 may be disposed in a matrix form and the index i and the index j may be the row and column numbers of the matrix.

As described above, the tester 200 may generate the local temperature values TLij based on the measured self-refresh current ISRij by executing the conversion program (operation S206). For example, the local temperature values TLij and the sensor temperature values TS may be stored in form of data files that may be read by the computing system. Additional information such as a test date, a DUT name, a test board ID, cycle numbers, a handler name, etc. may be stored together in the data files. The tester 200 or the external computing system displays the local temperature values TLij and the sensor temperature values TS in the two-dimensional map on the monitor screen as described above (operation S208).

As such, when the tester 200 wants to measure the temperature distribution of the DUTs 300 inside the chamber 110, it is sufficient to output the self-refresh command SF-CMD and measure the self-refresh currents ISRij and thus the temperature measurement may be performed conveniently using the Li-TCSR circuit in the DUT 300.

Figure 5:
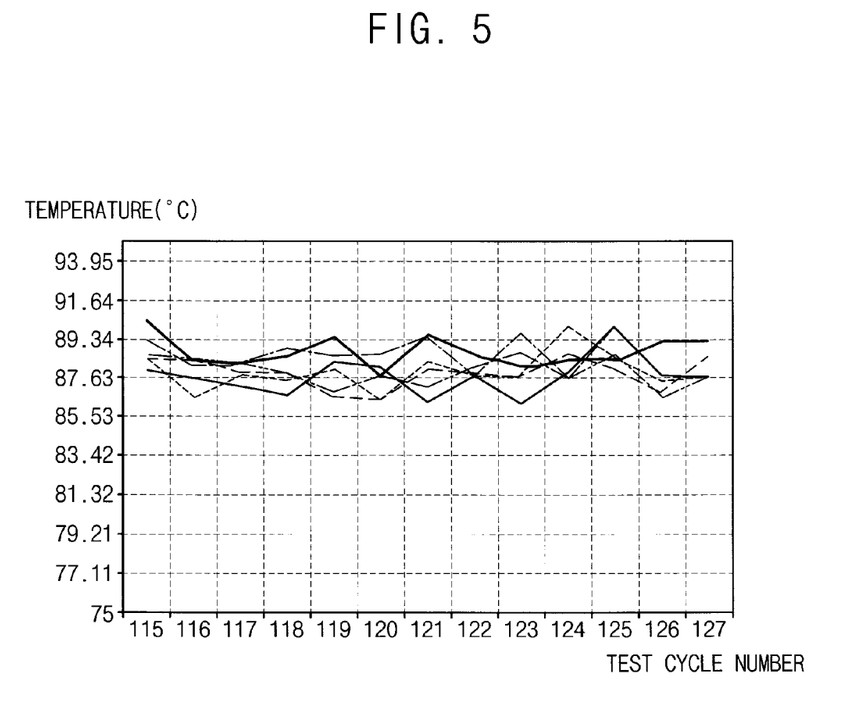
FIG. 5 is a diagram illustrating temperature variation curves of a plurality of devices under test.

FIG. 5 is a diagram illustrating temperature variation curves of a plurality of devices under test. In FIG. 5, the horizontal reference axis indicates the test cycle number and the vertical reference axis indicates the local temperature. For example, a plurality of the temperature variation curves may be displayed on the monitor screen such that the temperature variation curves are overlapped as illustrated in FIG. 5 where each temperature variation curve corresponds to each DUT. In this case, the overall temperature variation inside the chamber may be grasped more easily. In contrast, one temperature variation curve may be displayed on the monitor screen, where the temperature variation curve corresponds to a selected DUT, to analyze the temperature variation of the particular DUT.

Figure 6:
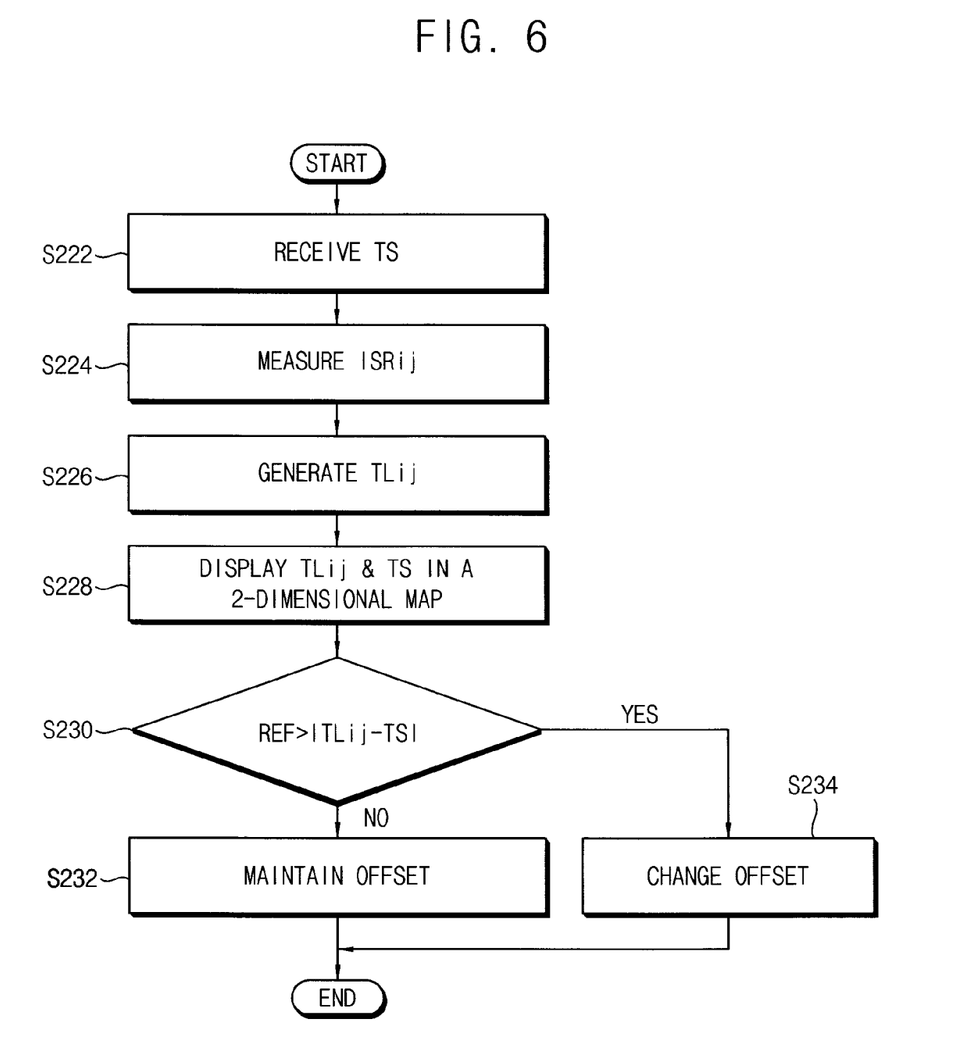
FIG. 6 is a flowchart illustrating a method of controlling inner temperature of a chamber included in a test handler according to another example embodiment.

FIG. 6 is a flowchart illustrating a method of controlling inner temperature of a chamber included in a test handler according to another example embodiment.

As described with reference to FIG. 4, the tester 200 executes a temperature control program and output the heater driving signal HDS and the fan driving signal FDS to heat and circulate the inner air of the chamber 110. The tester 200 receives the sensor temperature values TS from the temperature sensors 116 (operation S222). The tester 200 outputs the self-refresh command SF-CMD to operate the DUTs 300 in the self-refresh mode. The Li-TCSF circuit in the DUT 300 senses the respective operational temperature and adjusts the self-refresh period. The tester 200 measures the self-refresh currents ISRij of the respective DUTs 300 (operation S224). The DUTs 300 may be disposed in a matrix form and the index i and the index j may be the row and column numbers of the matrix. As described above, the tester 200 may generate the local temperature values TLij based on the measured self-refresh current ISRij by executing the conversion of program (block S226). For example, of the local temperature values TLij and the sensor temperature values TS may be stored in form of data files that may be read by the computing system. Additional information such as a test date, a DUT name, a test board ID, cycle numbers, a handler name, etc. may be stored together in the data files. The tester 200 or the external computing system displays the local temperature values TLij and the sensor temperature values TS in the two-dimensional map on the monitor screen as described above (operation S228).

The local temperature values TLij may be compared with the sensor temperature values TS and offset values for controlling the inner temperature of the chamber may be adjusted based on the comparison results. When the differences between the local temperature values TLij and the sensor temperature values TS are smaller than or equal to a reference value REF (operation S230: NO), the offset value is maintained (operation S232). When the differences between the local temperature values TLij and the sensor temperature values TS are greater than a reference value REF (operation S230: YES), the offset value is changed (operation S234) so that the deviation of temperature may be reduced.

As such, the tester 200 may measure the temperature distribution of the DUTs 300 inside the chamber 110 in real-time and directly control the inner temperature of the chamber 110 in real-time by adjusting the offset values based on the measured temperature data.

According to above-described embodiments, the semiconductor devices having Li-TCSR function may be tested effectually. Various semiconductor memory devices such as a mobile DRAM include the Li-TCSR circuit. In case of the mobile DRAM, the temperature distribution, that is, the local temperature values corresponding to the mobile DRAM in the chamber may be generated simply by measuring the self-refresh currents of the mobile DRAM. When testing the semiconductor devices without the Li-TCSR function, the above-described methods may be adopted directly. In some example embodiments, a printed a circuit board on which the mobile DRAM is mounted may be used to measure the temperature distribution in the chamber that is configured to test the semiconductor devices that do not have the Li-TCSR function as described below. For example, the mobile DRAM having the Li-TCSR function may be provided as a general-purpose package. In other words, the mobile DRAM may be mounted on a test substrate having an interface so that the substrate may be coupled to a socket of the test board for testing the DUT without having the Li-TCSR function.

Figure 7:
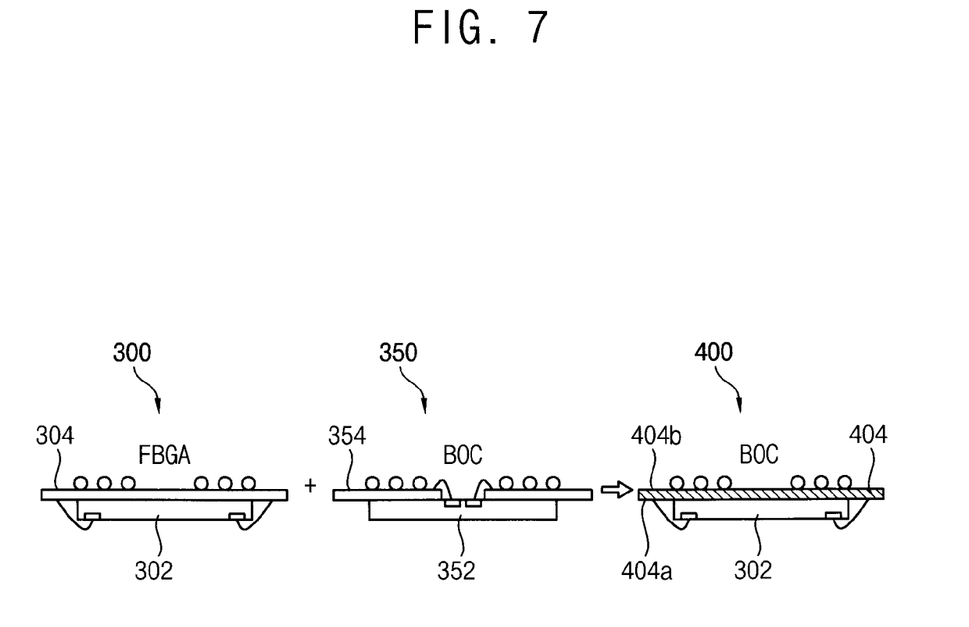
FIG. 7 is a diagram for describing a test element including a mobile DRAM device having function of Li-TCSR.

FIG. 7 is a diagram for describing a test element including a mobile DRAM device having function of Li-TCSR.

Referring to FIG. 7, a mobile DRAM 300 may be packaged such that a DRAM die 302 is mounted on a substrate 304 having an interface of a fine-pitch ball grid array (FBGA) type. If the device under test (DUT) 350 is packaged such that a die 352 is mounted on a substrate 354 having an interface of a board on chip (BOC) type, a test element 400 according to an example embodiment may be packaged such that the mobile DRAM 302 having the Li-TCSR function is mounted on a test substrate 404 having the same interface of the BOC type as the DUT 350.

A circuit pattern for electrically connecting the DRAM die 302 may be formed on a die connection surface 404a of the test substrate 404 and a ball connection circuit pattern of the DUT 350 may be formed on a ball connection surface 404b of the test substrate 404. The circuit patterns on both surfaces are internally connected for performing the temperature measurement.

Using the plurality of the test elements 400, the inner temperature of the chamber for testing the DUTs not having the Li-TCSR function may be measured efficiently and exactly and offset adjustment for the temperature control may be performed in real-time.

Figure 8A:
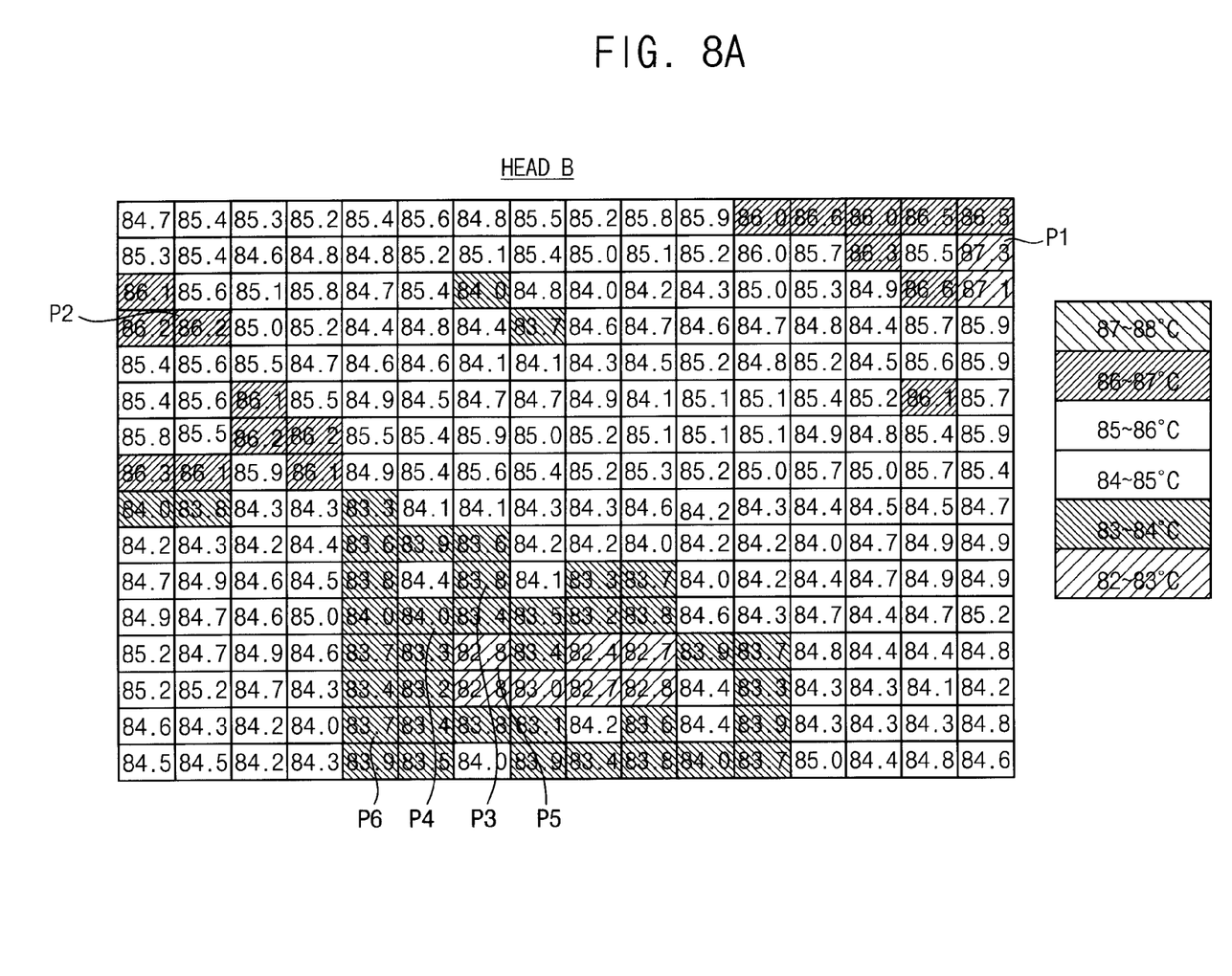
FIG. 8A is a diagram illustrating an example of a two-dimensional map displayed on a monitor screen according to another example embodiment.
Figure 8B:
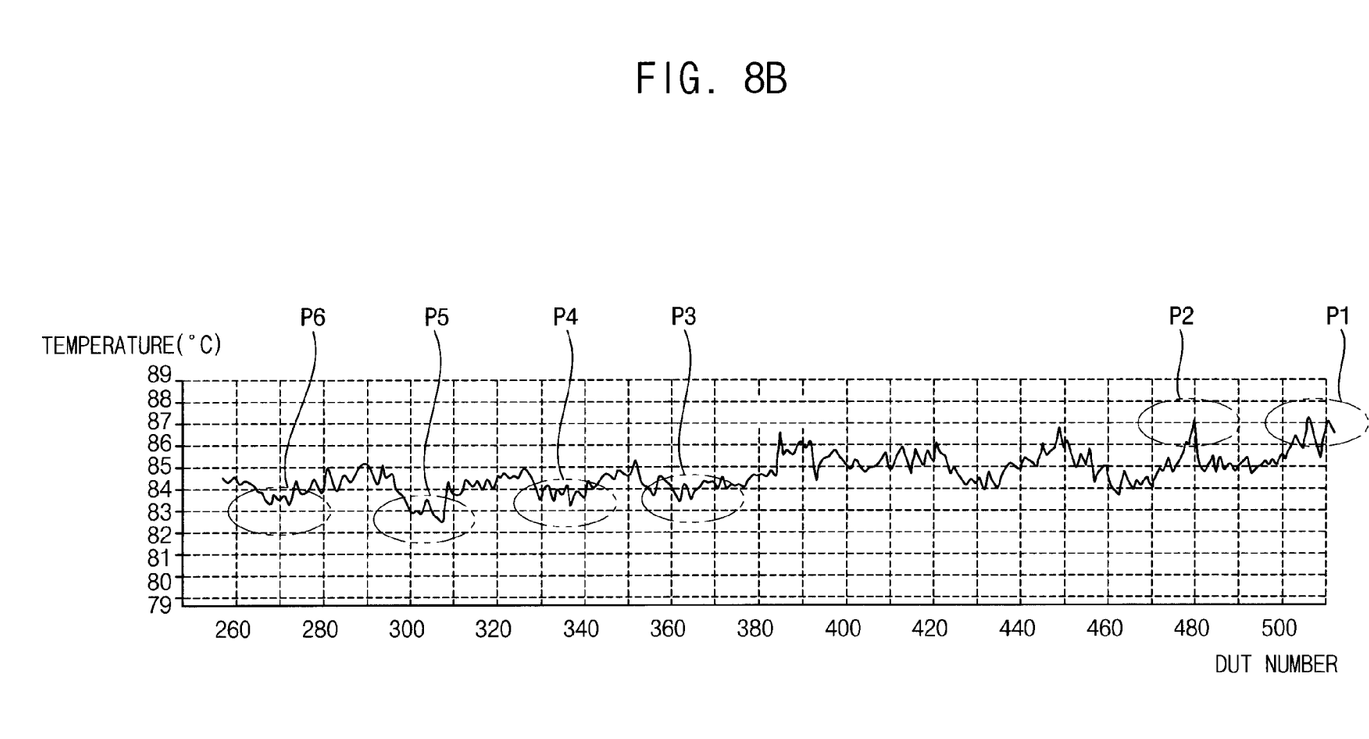
FIG. 8B is a diagram illustrating a temperature distribution corresponding to the two-dimensional map of FIG. 8A.

FIG. 8A is a diagram illustrating an example of a two-dimensional map displayed on a monitor screen according to another example embodiment, and FIG. 8B is a diagram illustrating a temperature distribution corresponding to the two-dimensional map of FIG. 8A.

For example, an apparatus named A623_B may include two heads (heads A and B) such that each head may test 256 DUTs that are disposed in a matrix form of 16 rows and 16 columns. For convenience of illustration, the two-dimensional map corresponding to the head B is illustrated in FIG. 8A. As described above, the local temperature values in the two dimensional map may be represented by a numerical display, a color display or a combination of the numerical display and the color display.

In FIG. 8B, the horizontal reference axis represents the DUT number, the vertical reference axis represents the local temperature value and the temperature distribution of 256 DUT of number 257 through number 512 in the head B. As illustrated in FIGS. 8A and 8B, the local temperature values are centered on about 85° C. and temperature deviation of about 4° C. is shown in the two-dimensional map between the DUTs disposed in the right-upper portion and the DUTs disposed in the bottom portion. The DUTs of relatively high temperature in portions P1 and P2 are checked as overkill and the DUTs of relatively low temperature in Portions P3, P4, P5 and P6 are checked as abnormal reliability. As such, the temperature deviation between the DUTs may be more easily monitored and the temperature control may be performed based on the measured temperature distribution to reduce the temperature deviation.

Even though the present inventive concepts are described with the particular numbers of heads, DUTs and temperature sensors for convenience of description, it may be understood that the numbers of heads, DUTs and temperature sensors may be determined variously. In addition, the example embodiments may be applied to various semiconductor devices having an interface different from the BOC type.

Features and/or embodiments described herein may be applied to any photo-detection device, such as a three-dimensional image sensor providing image information and depth information about an object. For example, one or more example embodiments may be applied to a computing system, such as a face recognition security system, a desktop computer, a laptop computer, a digital camera, a three-dimensional camera, a video camcorder, a cellular phone, a smart phone, a personal digital assistant (PDA), a scanner, a video phone, a digital television, a navigation system, an observation system, an auto-focus system, a tracking system, a motion capture system, an image-stabilizing system, etc.

The foregoing is illustrative of example embodiments and is not to be construed as limiting thereof. Although a few example embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method comprising:
measuring self-refresh currents of semiconductor memory devices under test, the semiconductor memory devices under test disposed in a chamber included in a test handler and having a function of linear temperature compensated self-refresh (Li-TCSR); and
generating local temperature values based on the self-refresh currents, each local temperature value indicating a temperature near a corresponding semiconductor memory device of the semiconductor memory devices under test.

2. The method of claim 1, further comprising:
receiving sensor temperature values from temperature sensors in the chamber; and
displaying the sensor temperature values in a two-dimensional map on a monitor screen such that a disposition of the sensor temperature values in the two-dimensional map corresponds to a disposition of the temperature sensors in the chamber.

3. The method of claim 1, wherein the measuring measures self-refresh currents of mobile dynamic random access memory (DRAM) devices.

4. The method of claim 1, further comprising:
displaying the local temperature values in a two-dimensional map on a monitor screen such that a disposition of the local temperature values in the two-dimensional map corresponds to a disposition of the semiconductor memory devices under test in the chamber.

5. The method of claim 4, wherein the displaying includes representing the local temperature values by one of a numerical display, a color display and a combination of the numerical display and the color display.

6. The method of claim 4, wherein the displaying displays a temperature variation curve on the monitor screen, the temperature variation curve corresponding to a selected device among the semiconductor memory devices under test.

7. The method of claim 4, wherein the displaying displays temperature variation curves on the monitor screen such that the temperature variation curves are overlapped, each temperature variation curve of the temperature variation curves corresponding to each semiconductor device of the semiconductor memory devices under test.

8. A method of controlling an inner temperature of a chamber included in a test handler in real-time, the method comprising:
measuring self-refresh currents of semiconductor memory devices, the semiconductor memory devices disposed in the chamber and having a function of linear temperature compensated self-refresh (Li-TCSR);
generating local temperature values based on the self-refresh currents, each local temperature value indicating a temperature near a corresponding semiconductor memory device of the semiconductor memory devices;
receiving sensor temperature values from temperature sensors in the chamber, each sensor temperature indicating a temperature near the corresponding temperature sensor of the temperature sensors;
comparing the local temperature values and the sensor temperature values; and
adjusting offset values for controlling the inner temperature of the chamber based on the comparison results.

9. The method of claim 8, further comprising:
displaying the local temperature values in a two-dimensional map on a monitor screen such that a disposition of the local temperature values in the two-dimensional map corresponds to a disposition of the semiconductor memory devices in the chamber; and displaying the sensor temperature values in the two-dimensional map on the monitor screen such that a disposition of the sensor temperature values in the two-dimensional map corresponds to a disposition of the temperature sensors in the chamber.

10. The method of claim 9, wherein the displaying includes representing the local temperature values by one of a numerical display, a color display and a combination of the numerical display and the color display.

11. The method of claim 9, wherein the displaying displays a temperature variation curve on the monitor screen, the temperature variation curve corresponding to a selected device among the semiconductor memory devices.

12. The method of claim 9, wherein the displaying displays temperature variation curves on the monitor screen such that the temperature variation curves are overlapped, each temperature variation curve of the temperature variation curves corresponding to each semiconductor device of the semiconductor memory devices.

13. The method of claim 9, wherein the measuring measures self-refresh currents of mobile dynamic random access memory (DRAM) devices and the chamber is configured to test semiconductor devices different from the mobile DRAM devices.

14. The method of claim 13, further comprising:

packaging the mobile DRAM devices on a test substrate, the mobile DRAM devices having same input-output connections as the semiconductor devices.

15. A method comprising:

measuring self-refresh currents of semiconductor memory devices in a chamber included in a test handler;

generating local temperature values based on the self-refresh currents, each local temperature value indicating a temperature near a corresponding semiconductor memory device of the semiconductor memory devices; and adjusting offset values based on the local temperature values.

16. The method of claim 15, further comprising:

receiving sensor temperature values from temperature sensors in the chamber; and displaying the sensor temperature values in a two-dimensional map on a monitor screen such that a disposition of the sensor temperature values in the two-dimensional map corresponds to a disposition of the temperature sensors in the chamber.

17. The method of claim 15, further comprising:

displaying the local temperature values in a two-dimensional map on a monitor screen such that a disposition of the local temperature values in the two-dimensional map corresponds to a disposition of the semiconductor memory devices in the chamber.

18. The method of claim 17, wherein the displaying includes representing the local temperature values by one of a numerical display, a color display and a combination of the numerical display and the color display.

19. The method of claim 17, wherein the displaying displays a temperature variation curve on the monitor screen, the temperature variation curve corresponding to a selected device among the semiconductor memory devices.

* * * * *